(12) United States Patent
Shih et al.

(10) Patent No.: US 6,974,094 B2
(45) Date of Patent: Dec. 13, 2005

(54) ANTI-CORROSION SHOWER HEAD USED IN DRY ETCHING PROCESS AND METHOD OF MANUFACTURING THE SAME

(75) Inventors: Cheng-Lung Shih, Changhua (TW); Hao-Chi Kuo, Hsinchu (TW); Yung-Hsiang Hu, Taichung (TW); Ying-Chi Hsu, Pingjen (TW)

(73) Assignee: AU Optronics Corp., Hsinchu (TW)

( * ) Notice: Subject to any disclaimer, the term of this patent is extended or adjusted under 35 U.S.C. 154(b) by 208 days.

(21) Appl. No.: 10/614,576

(22) Filed: Jul. 7, 2003

(65) Prior Publication Data

US 2004/0124280 A1 Jul. 1, 2004

(30) Foreign Application Priority Data

Nov. 29, 2002 (TW) ........................................ 91134749 A

(51) Int. Cl.[7] ................................................ B05B 1/00
(52) U.S. Cl. ..................... 239/596; 239/589; 239/590.5
(58) Field of Search ................................ 239/596, 590, 239/590.5, 589

(56) References Cited

U.S. PATENT DOCUMENTS

| | | | | |
|---|---|---|---|---|
| 5,916,720 A | * | 6/1999 | Springett | 430/63 |
| 6,527,368 B1 | * | 3/2003 | Giri et al. | 347/44 |
| 2002/0015081 A1 | * | 2/2002 | Okazaki et al. | 347/65 |
| 2002/0056698 A1 | * | 5/2002 | Makigaki et al. | 216/27 |

FOREIGN PATENT DOCUMENTS

JP 09239994 A * 9/1997 ............. B41J/2/16

OTHER PUBLICATIONS

NB920643–IBM Disclosuure Doucument: Fabrication of Ink JEt Printer HEad Compnents by Thrrough Mask Electrochamical Micromachining, IBM Technical Disclosure Bulletin, Jun. 1992 vol. 35, Issue 1B, pp. 453–454.*

* cited by examiner

Primary Examiner—David A. Scherbel
Assistant Examiner—James S. Hogan
(74) Attorney, Agent, or Firm—Thomas, Kayden, Horstemeyer & Risley

(57) ABSTRACT

An anti-corrosion shower head used in a dry etching tool comprises an aluminum base and a ceramic plate embedded in the aluminum base, wherein the ceramic plate has a number of gas holes to spray the etching gas. An oxalic acid is used for electroplating the shower head, and also the aluminum part on the rear side of the ceramic plate or engineering polymer plate is hollowed.

18 Claims, 3 Drawing Sheets

ANTI-CORROSION SHOWER HEAD USED IN DRY ETCHING PROCESS AND METHOD OF MANUFACTURING THE SAME

This application claims the benefit of Taiwan application Serial No. 91134749, filed Nov. 29, 2002.

BACKGROUND OF THE INVENTION

1. Field of the Invention

The present invention relates in general to a shower head used in dry etching process, and more particularly, to a manufacturing method and an improved structure of anti-corrosion shower head used in dry etching process.

2. Description of the Related Art

In the chamber of a dry etching process, a shower head is used for spraying an etching gas. Referring to FIG. 1A, it is a front view of a conventional shower head. The shower head 100 consists of a large cross-shaped aluminum base 102 and a small cross-shaped ceramic nozzle plate 104, wherein the aluminum base 102 has a front side and a rear side while the ceramic nozzle plate 104 is embedded at the center of the front side of the aluminum base 102. Referring to FIG. 1B, it is a rear view of the shower head in FIG. 1A. There are a number of gas holes formed on the rear side 108 of the aluminum base 102, which the positions of the gas holes are corresponding to the ceramic nozzle plate 104, to spray the etching gas.

The conventional shower head 100 is electroplated in the solution of sulphuric acid ($H_2SO_4$) to coat an $Al_2O_3$ film on the aluminum surface. Such treatment is well known as "hard anodizing treatment". Normally, the $Al_2O_3$ film coated by the electroplating solution of sulphuric acid has a thickness of 45~55 μm. In the chamber of dry etching process, plasma is generated and maintained via a high power radio frequency (RF). Moreover, all the gases, such as $SF_6$, $Cl_2$, $BCl_3$ and HCl, used in the dry etching process are corrosive. Taking $SF_6$, a nontoxic etching gas, as the example, corrosive fluoride ions will be produced after $SF_6$ is de-ionized via a high power radio frequency. The $Al_2O_3$ film formed on the aluminum surface of the shower head is plasma resisting and corrosion resisting as well.

Although the front side 106 of the shower head 102 has a cross-shaped ceramic nozzle plate 104, the rear side 108 of the shower head 102 is still an aluminum substrate. Also, very low pressure (about 2 mtorr) and high power radio frequency is applied when the shower head 102 is operated. Thereby, the corrosive etching gas sprayed through the gas holes 110 in a certain velocity of flow will corrode the central part of the rear side 108 of the shower head 102 and gas holes 110 as well. The serious corrosion damage occurs on the sharp edges of the gas holes 110, especially.

Referring to FIG. 2A, it is a side view of a single gas hole covered by an $Al_2O_3$ film. The gas hole 200 of the unused shower head 100 has a complete and even $Al_2O_3$ film 202. It is noted that the $Al_2O_3$ film 202 on the sharp corners of the gas hole is thinner on that on the lateral sides. Referring to FIG. 2B, it is a side view of a single gas hole after parts of the $Al_2O_3$ film has peeled off. After the shower head 100 has been used over a period of time, the $Al_2O_3$ film starts to peel off due to plasma collision and etching gas corrosion. The peeling off phenomena is first started at the sharp corners 204 of the gas hole; so as to expose the sharp corners 204 to the air.

The $Al_2O_3$ film coated on the aluminum surface has the function of anti-corrosion and insulation. If a high radio frequency is applied, the air surrounding the exposed sharp corners 204 of the gas hole will be ionized and discharged. This phenomenon is called the "point discharge", which always results in short-circuit. Despite that the shower head is recoated or the sharp corners 204 of the gas hole are rounded, corrosion still occurs after a while. Besides, the particle issue, which arises due to corrosion, will influence the yield of the product. Generally, the shower head needs to be cleaned and maintained (PM) in about one week, and needs to be replaced in a fortnight's time. In other words, the shower head has a PM cycle time of about one week's time while its service life is about two weeks' time. Also, it is very exhausting and time-consuming to clean and maintain the shower head. The detached shower head needs to be immersed in isopropyl alcohol (IPA), otherwise, the acid gas, which stays on the surface of the detached shower head, will react with the moisture contained in the air and become a strong acid. After the IPA immersion, the shower head needs to be purged by nitrogen gas, and dried for 30 minutes at a high temperature. The cleaning process in a round takes at least 8 hours.

According to the description above, a conventional shower head used in the etching process of will be corroded in a short period of a time. It requires not only the cleaning process but also the replacement of the shower head. The frequent replacement of expensive shower heads is a great burden to semi-conductor manufacturers. Moreover, the particle issue arising due to corrosion further reduces the yield of products.

SUMMARY OF THE INVENTION

It is therefore an object of the present invention to provide a shower head with excellent anti-corrosion ability and the method of manufacturing the same, so that the improved shower head possesses a longer service life and a lower production cost.

According to one preferred embodiment of the present invention, an anti-corrosion shower head used in a dry etching machine comprises an aluminum base and a ceramic plate embedded in the aluminum base, wherein the ceramic plate has a number of gas holes to spray an etching gas. The aluminum base has a front side and a rear side; the ceramic plate is embedded in the front side of the aluminum base while the part of the rear side of the aluminum base corresponding to the ceramic plate is hollowed. Moreover, engineering polymer such as polyimide resin (VESPEL®, a product of DuPont, for instance) can be used as the nozzle plate and also embedded at the center of the aluminum base to spray the etching gas.

According to another preferred embodiment of the present invention, a method for manufacturing the anti-corrosion shower head is disclosed The method comprising the steps of: coating an $Al_2O_3$ film on the surface of the shower head by electrodepositing an oxalic acid solution. The shower head is electroplated in the solution of oxalic acid to coat an $Al_2O_3$ film on the surface thereof. The shower head according to the present invention has excellent anti-corrosion ability; thereby, the service life of the shower head is prolonged and the manufacturing cost is reduced. Also, no particle issue is concerned so that it is easy to clean and maintain the shower head of the present invention.

Other objects, features, and advantages of the present invention will become apparent from the following detailed description of the preferred but non-limiting embodiments. The following description is made with reference to the accompanying drawings.

DETAILED DESCRIPTION OF THE INVENTION

In the present invention, the conventional electroplating solution of sulphuric acid is replaced by the solution of oxalic acid. According to the experimental data, the $Al_2O_3$ film coated by the solution of oxalic acid has a thickness of about 25~35 µm, which is thinner than that coated by the solution of sulphuric acid. However, the new coating of $Al_2O_3$ film provides a better ability of anti-corrosion and prolongs the service life of the shower head to about 3 months, which is 6 times longer than that of a conventional shower head.

Besides using the solution of oxalic acid as the electroplating solution in the present invention, the physical structure of the shower head is also improved and described in the following paragraphs.

Figure 3A:
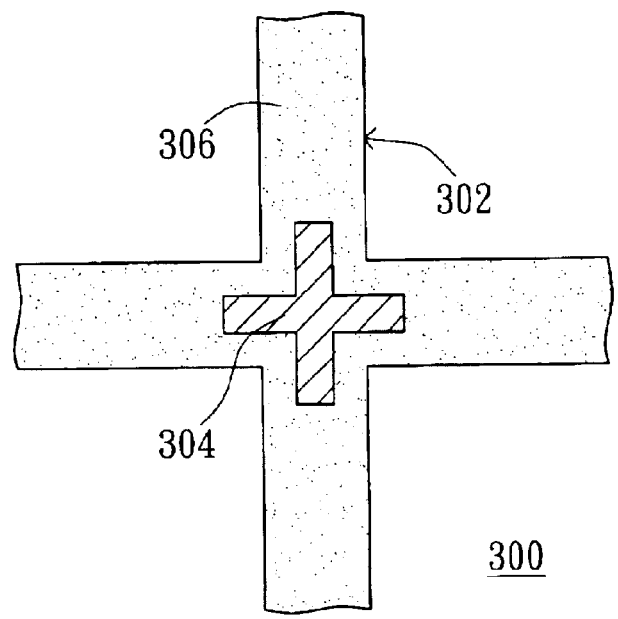
FIG. 3A is a front view of a shower head according to a preferred embodiment of the present invention.

FIG. 3A is a front view of a shower head according to a preferred embodiment of the present invention. The front side 306 of the improved shower head 300, comprises a large cross-shaped aluminum base 302 and a small cross-shaped ceramic nozzle plate 304, wherein the smaller one is embedded at the center of the larger one. The front view of the improved shower head 300 looks almost the same as the conventional shower head 100, except that the color is different. The darker aluminum base 302 and the golden ceramic nozzle plate are obtained due to the electroplating solution of oxalic acid.

Figure 1A:
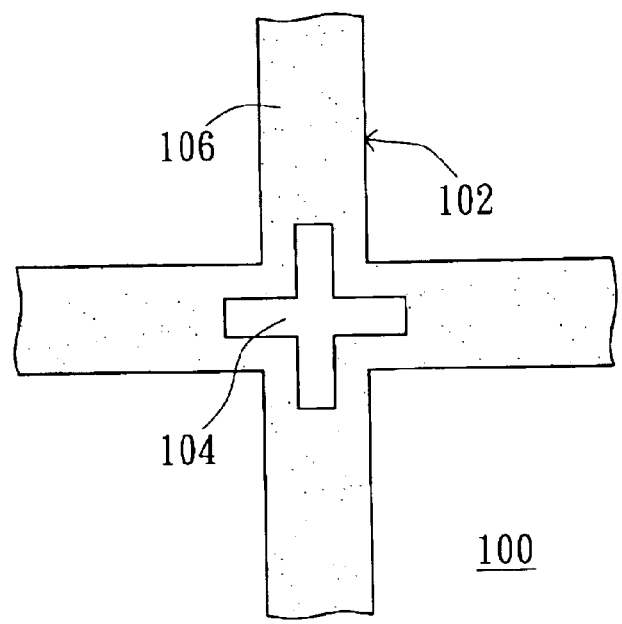
FIG. 1A is a front view of a conventional shower head.
Figure 1B:
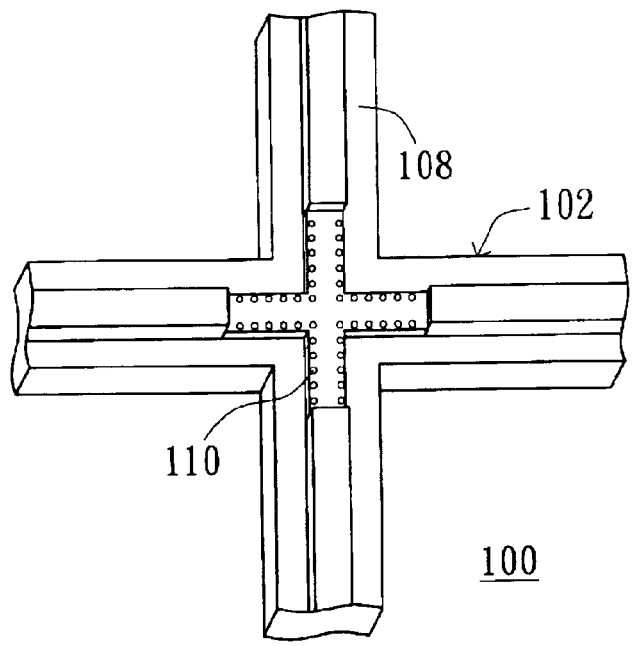
FIG. 1B is a rear view of the shower head in FIG. 1A.
Figure 2A:
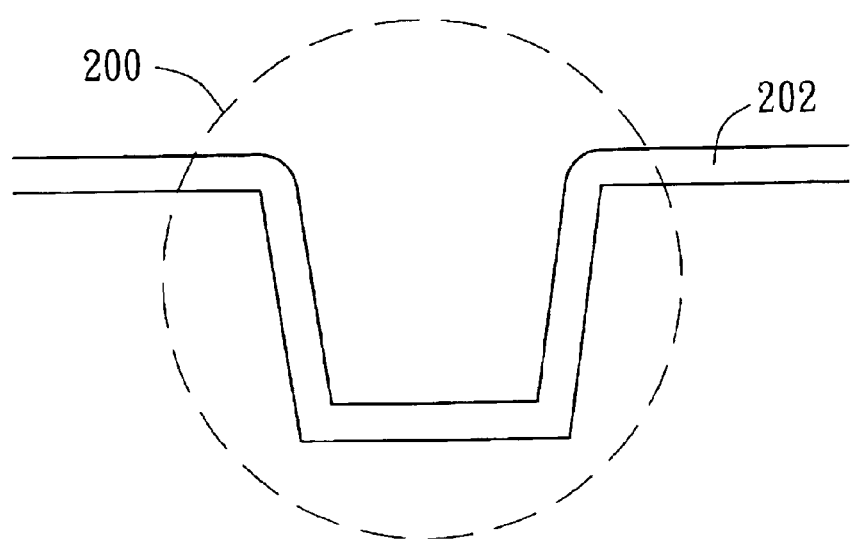
FIG. 2A is a side view of a single gas hole covered by a $Al_2O_3$ film.
Figure 2B:
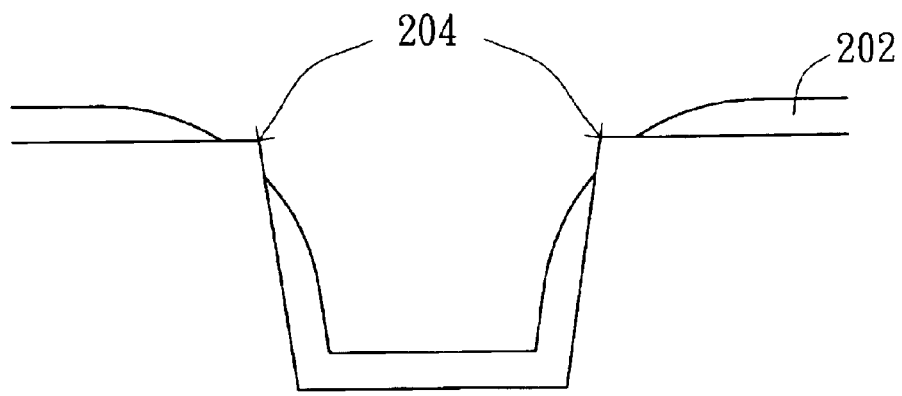
FIG. 2B is a side view of a single gas hole after part of the $Al_2O_3$ film has peeled off.
Figure 3B:
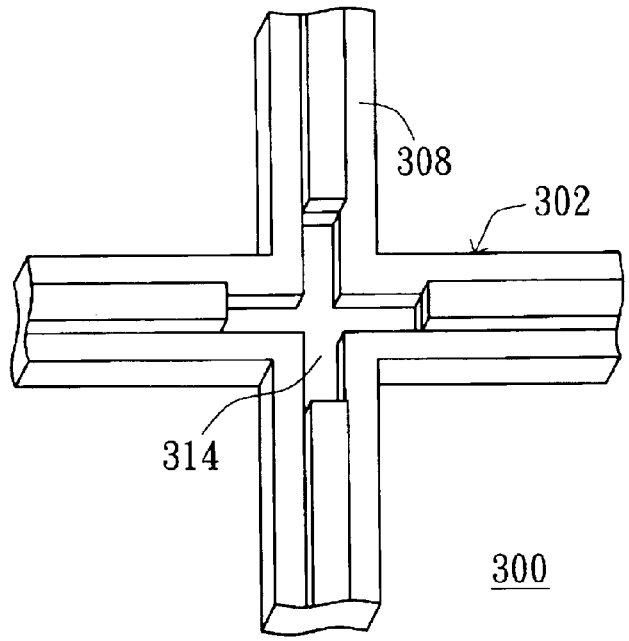
FIG. 3B is a rear view of the shower head in FIG. 3A.

Referring to FIG. 3B, it is a rear view of the shower head in FIG. 3A. According to the present invention, the part of the rear side 308 of the aluminum base, which corresponds to the ceramic nozzle plate 304, is hollowed. That is, the cross-shaped aluminum nozzle plate as shown in FIG. 2 is excavated to expose the rear side 314 of the ceramic nozzle plate to the air. Also, a number of gas holes (not shown) have been formed on the ceramic nozzle plate 304 to spray the etching gas. According to the present invention, the ceramic nozzle plate 304 is made of ceramics with purity of 99.5% or above. In the preferred embodiments, the ceramic nozzle plate 304 with a ceramic purity of 99.7% is used for providing a better anti-corrosion performance.

As the central part of the aluminum base is hollowed, the corrosive etching gas contacts with the ceramic nozzle plate 304. Since ceramics has the function of insulation and has excellent performance in resisting plasma, corrosion and heat, the service life of the shower head can be prolonged to be 6 months, which is 12 times longer than that of a conventional shower head. Meanwhile, the particle issue caused by corrosion can be resolved and hence the yield of product can be improved.

With regard to the clean and maintenance of the shower head 300, since the particle issue and corrosion problem have been resolved, the PM cycle time can be further prolonged and the cleaning procedures can be omitted. All that needs to do is to immerse and then dry the detached shower head. Compared with the conventional cleaning and maintaining process, which takes at least 8 hours, this cleaning process of the present invention takes only about 3 hours.

Moreover, the abovementioned ceramic nozzle plate can be replaced by engineering polymer that possesses excellent characteristics of temperature resistance and high wear resistance. For example, VESPEL, a brand name for polyimide resin powders developed by DuPont, has best performance in terms of temperature and wear resistance among all polyimide resin the commercial market. Ever since it was commercial available in 1962, VESPEL has been widely used in manufacturing a diversity of parts for airplanes, space shuttles and military supplies; and is now widely used to manufacture various parts for automobiles, OA machines, electronic appliances, scientific instruments, industrial machines and production facilities, etc. If VESPEL, which has excellent anti-corrosion and ion-collision resistance, is applied to the shower head, the service life can be further prolonged to be 12 months.

The anti-corrosion shower head and the manufacturing method according to invention use oxalic acid as the electroplating solution of the shower head and hollow the aluminum part on the rear side of the ceramic nozzle plate (or engineering polymer nozzle plate) to solving the corrosion problem and other related problems as well. The advantages of the shower head according to the present invention includes: excellent anti-corrosion ability, long service life, no particle issue, easy to clean and maintain, prolonged PM cycle time and cost down.

While the present invention has been described by way of example and in terms of a preferred embodiment, it is to be understood that the present invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An anti-corrosion shower head used in a dry etching tool to spray a gas, comprising:

an aluminum base, having a front side and a rear side;

a ceramic nozzle plate embedded in the front side of the aluminum base while the rear side of the aluminum base corresponding to the ceramic nozzle plate being hollowed, and the ceramic nozzle plate having a plurality of gas holes to spray the gas; and an $Al_2O_3$ film formed on a surface of the shower head by electroplating in an oxalic acid solution.

2. The shower head according to claim 1, wherein the aluminum base is a cross-shaped piece of aluminum.

3. The shower head according to claim 1, wherein the ceramic nozzle plate is cross-shaped.

4. The shower head according to claim 1, wherein the ceramic nozzle plate is ceramics with purity of at least 99.5%.

5. The shower head according to claim 1, wherein the ceramic nozzle plate is embedded at the central part of the aluminum base.

6. An anti-corrosion shower head used in a dry etching tool to spray a gas, comprising:

an aluminum base, having a front side and a rear side;

an engineering polymer nozzle plate embedded in the front side of the aluminum base while the rear side of the aluminum base corresponding to the engineering polymer nozzle plate being hollowed, and the engineering polymer nozzle plate having a plurality of gas holes to spray the gas; and an $Al_2O_3$ film formed on a surface of the shower head by electroplating in an oxalic acid solution.

7. The shower head according to claim 6, wherein the aluminum base is a cross-shaped piece of aluminum.

8. The shower head according to claim 6, wherein the nozzle plate made of engineering polymer is cross-shaped.

9. The shower head according to claim 6, wherein the nozzle plate is made of polyimide resin.

10. The shower head according to claim 6, wherein the engineering polymer nozzle plate is embedded at the central part of the aluminum base.

11. A method for manufacturing an anti-corrosion shower head, comprising the steps of:

providing a shower head, the shower head having an aluminum base and a nozzle plate, and the nozzle plate embedded in a front side of the aluminum base while a rear side of the aluminum base corresponding to the nozzle plate below hollowed, and the nozzle plate having a plurality of gas holes;

providing an oxalic acid solution; and electroplating the shower head by the oxalic acid solution to from an $Al_2O_3$ film on the surface of the shower head.

12. The method according to claim 11, wherein the thickness of the $Al_2O_3$ film is about 25~35 $\mu$m.

13. The method according to claim 11, wherein the nozzle plate is a ceramic nozzle plate.

14. The method according to claim 13, wherein both the aluminum base and the ceramic nozzle plate are cross-shaped, and the ceramic nozzle plate is embedded at the central part of the aluminum base.

15. The method according to claim 13, wherein the ceramic nozzle plate is ceramics with purity of at least 99.5%.

16. The method according to claim 11, wherein the nozzle plate is made of engineering polymer.

17. The method according to claim 16, wherein both the aluminum base and the engineering polymer nozzle plate are cross-shaped, and the engineering polymer nozzle plate is embedded at the central part of the aluminum base.

18. The method according to claim 16, wherein the nozzle plate is made of polyimide resin.

* * * * *